(12) United States Patent
Kaviladath

(10) Patent No.: US 11,329,661 B1
(45) Date of Patent: May 10, 2022

(54) SOURCE FOLLOWER WITH NON-LINEARITY CANCELLATION

(71) Applicant: Texas Instruments Incorporated, Dallas, TX (US)

(72) Inventor: Jafar Sadique Kaviladath, Kozhikode (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/391,516

(22) Filed: Aug. 2, 2021

(51) Int. Cl.
*H03M 1/66* (2006.01)
*H03M 1/12* (2006.01)
*H03M 1/10* (2006.01)
*H03M 1/06* (2006.01)

(52) U.S. Cl.
CPC ............... *H03M 1/12* (2013.01); *H03M 1/66* (2013.01); *H03M 1/0607* (2013.01); *H03M 1/0617* (2013.01); *H03M 1/1014* (2013.01)

(58) Field of Classification Search
CPC ........ H03M 1/12; H03M 1/66; H03M 1/0617; H03M 1/0607; H03M 1/1014
See application file for complete search history.

(56) References Cited

U.S. PATENT DOCUMENTS 10,396,811 B1 * 8/2019 Rankin ............... H03M 1/0604

* cited by examiner

*Primary Examiner* — Joseph J Lauture
(74) *Attorney, Agent, or Firm* — John R. Pessetto; Charles A. Brill; Frank D Cimino

(57) ABSTRACT

A buffer circuit includes a first differential signal input, a second differential signal input, a first source follower circuit, and a second source follower circuit. The first source follower circuit includes a first signal output, and a first input transistor. The first input transistor is coupled to the first differential signal input, and is configured to drive the first signal output. The second source follower circuit includes a second signal output, a second input transistor, and a cascode transistor. The second input transistor is coupled to the second differential signal input, and is configured to drive the second signal output. The cascode transistor is coupled to the second input transistor and the first signal output, and is configured to compensate for non-linearity of the second input transistor based on an output signal provided at the first signal output.

20 Claims, 7 Drawing Sheets

SOURCE FOLLOWER WITH NON-LINEARITY CANCELLATION

BACKGROUND

Buffers are often used in semiconductor devices to isolate one portion of the device from another portion, generally to minimize the characteristics of one portion from influencing the operation of the other portion. A buffer generally contains at least one transistor and the buffer is termed a "source follower" when the output is provided from the source terminal of a field effect transistor. Similarly, the buffer is referred to as an emitter follower when the output is provided from an emitter terminal of a bipolar junction transistor. In both cases, the input signal is provided to the control (gate or base) terminal of the transistor.

Buffers often drive switching loads. A switching load generally refers to a bad which is electrically connected and disconnected from (a source of) a signal in different intervals of time. Examples of switching loads include switched-capacitor components such as switched-capacitor analog to digital converters, switched capacitor filters, etc. In a common configuration associated with switching loads, a buffer receives the input signal, and provides a corresponding output signal to the switching load.

It is generally desirable that an output signal of a buffer have as linear a relation as possible with an input signal, i.e., the buffer operates with a high degree of linearity to ensure that the output signal is a correct representation of the input signal.

SUMMARY

In one example, a buffer circuit includes differential signal inputs, a first source follower circuit, and a second source follower circuit. The first source follower circuit includes a first signal output, a first transistor, and a second transistor. The first transistor includes a control terminal and a current terminal. A control terminal is coupled to one of the differential signal inputs. The current terminal is coupled to the first signal output. The second transistor includes a current terminal and a control terminal. The current terminal of the second transistor is coupled to the current terminal of the first transistor. The second source follower circuit includes a signal output and a third transistor. The signal output is coupled to the control terminal of the second transistor. The third transistor includes a control terminal and a current terminal. The control terminal of the third transistor is coupled to one of the differential signal inputs. The current terminal of the third transistor is coupled to the signal output.

In another example, a buffer circuit includes a first differential signal input, a second differential signal input, a first source follower circuit, and a second source follower circuit. The first source follower circuit includes a first signal output, and a first input transistor. The first input transistor is coupled to the first differential signal input, and is configured to drive the first signal output. The second source follower circuit includes a second signal output, a second input transistor, and a cascode transistor. The second input transistor is coupled to the second differential signal input, and is configured to drive the second signal output. The cascode transistor is coupled to the second input transistor and the first signal output, and is configured to compensate for non-linearity of the second input transistor based on an output signal provided at the first signal output.

In a further example, an analog-to-digital converter (ADC) includes a capacitive digital-to analog converter (DAC) and a buffer circuit. The buffer circuit is coupled to, and configured to drive, the capacitive DAC. The buffer circuit includes differential signal inputs, a first source follower circuit, and a second source follower circuit. The first source follower circuit is coupled to the differential signal inputs, and has a first signal output coupled to the capacitive DAC. The second source follower circuit has a second signal output, an input transistor, and a cascode transistor. The second signal output is coupled to the capacitive DAC. The input transistor is coupled to the differential signal inputs and is configured to drive the second signal output. The cascode transistor is coupled to the input transistor and the first signal output, and is configured to compensate for non-linearity of the input transistor based on an output signal of the first source follower circuit.

BRIEF DESCRIPTION OF THE DRAWINGS

For a detailed description of various examples, reference will now be made to the accompanying drawings in which.

The same reference numbers and other reference designators are used in the drawings to designate the same or similar (functionally and/or structurally) features.

DETAILED DESCRIPTION

A source follower circuit may be used as an input buffer in a variety of applications. For example, a source follower circuit may be used to buffer an input signal in an analog-to-digital converter (ADC). When a source follower circuit is used with lower power supply voltages (e.g., 1.8 volts) and a large input signal swing (e.g., 2 volts peak to peak), the limited drain-source voltage of the input transistor and the drain-source conductance ($G_{ds}$) non-linearity of the input transistor contribute to increased third harmonic distortion (HD3) in the output of the source follower circuit, which limits the performance of the ADC. HD3 is the dominate harmonic contributing to non-linearity in differential systems.

Embodiments of the source follower circuit described herein compensate for $G_{ds}$ non-linearity of the input transistor by providing a compensation current that corresponds to the current flowing in the input transistor due to the $G_{ds}$ non-linearity. The compensation current is produced by using a signal that is complementary to the output of the source follower circuit to control a cascode transistor in a current source of the source follower circuit. Embodiments of the source follower circuit may include a switched capacitor attenuator that controls the amplitude of the complementary signal applied to the cascode transistor. The attenuation provided by the switched capacitor attenuator may be selected to optimize reduction of HD3 at the output of the source follower circuit.

Figure 1:
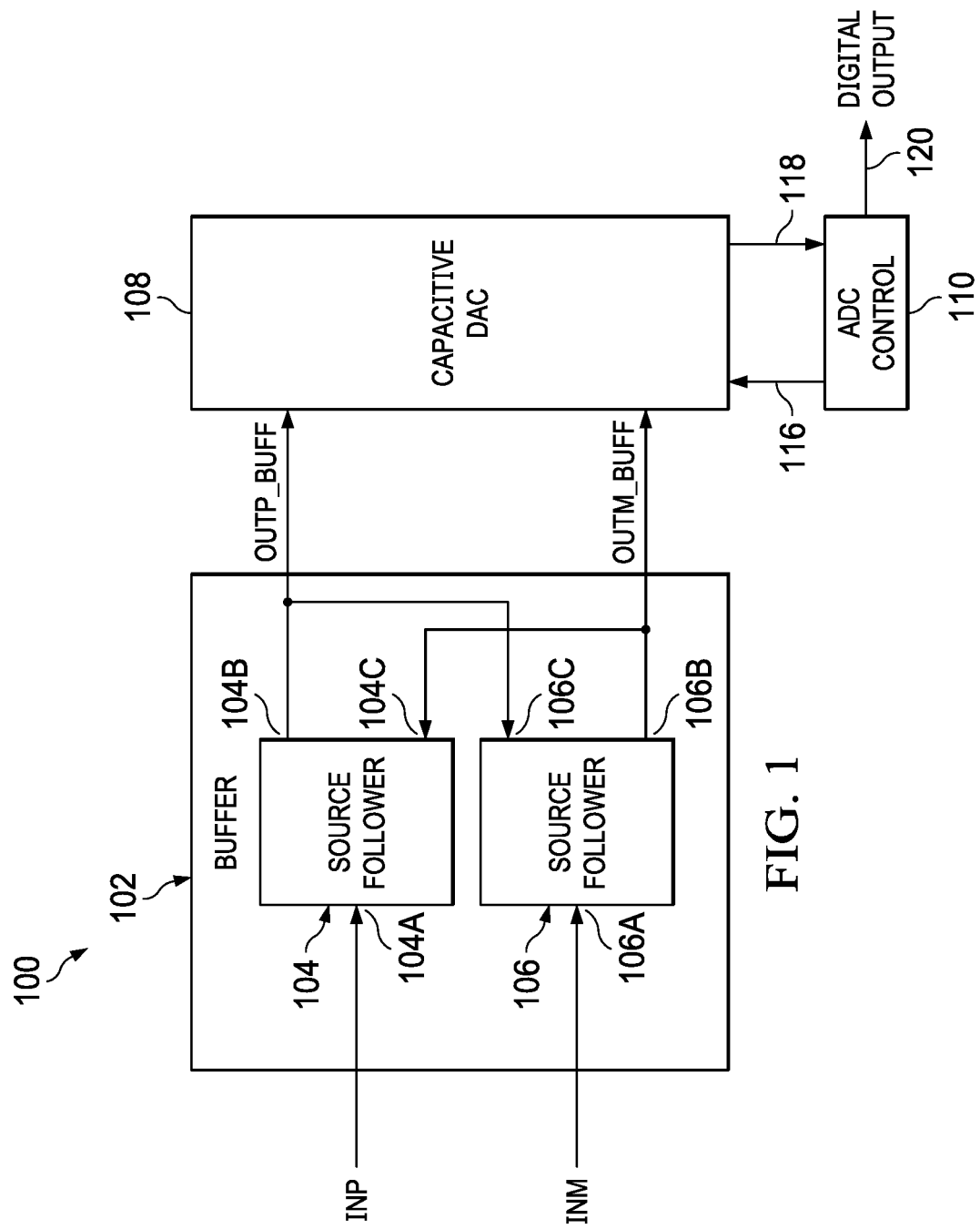
FIG. 1 is a block diagram for an example analog-to-digital converter (ADC) that includes a buffer circuit as described herein.

FIG. 1 illustrates a block diagram for an example ADC 100. The ADC 100 includes a buffer circuit 102, a capacitive digital-to-analog converter (CDAC) 108, and ADC control circuitry 110. The buffer circuit 102 (coupled to CDAC 108) provides signals to be digitized by the CDAC 108. The ADC control circuitry 110 is coupled to, and controls, to the CDAC 108. The CDAC 108 includes one or more capacitor ladders and switches coupled to the rungs of the capacitor ladder. The switches switch input signals received from the buffer circuit 102 and reference voltages to the capacitor ladder. The ADC control circuitry 110 includes circuitry that performs a binary search for a digital value representative of the signal (the differential signal composed of OUTP_BUFF and OUTM_BUFF) received by the CDAC 108 from the buffer circuit 102. On completion of the binary search, the ADC control circuitry provides the digital value to external circuitry as the digital output 120. To perform the binary search, the ADC control circuitry 110 generates switch control signals 116 to control the switches of the CDAC 108 based on the signals 118 output by the CDAC 108.

The buffer circuit 102 includes source follower circuit 104 and a source follower circuit 106. The source follower circuit 104 includes an input 104A for receiving a signal INP to be buffered, and an output 104B for providing the signal OUTP_BUFF to the CDAC 108. The source follower circuit 106 includes an input 106A for receiving a signal INM to be buffered, and an output 106B for providing the signal OUTM_BUFF to the CDAC 108. The signals INP and INM form a differential signal to be buffered by the buffer circuit 102 and digitized (by the ADC 100), and the inputs 104A and 106A are differential signal inputs for receiving the differential signal.

The source follower circuit 104 also includes an input 104C coupled to the output 106B of the source follower circuit 106 for receiving the signal OUTM_BUFF from the source follower circuit 106. The source follower circuit 104 applies OUTM_BUFF to compensate the $G_{ds}$ non-linearity of the source follower circuit 104 as described below. Similarly, the source follower circuit 106 includes an input 106C coupled to the output 104B of the source follower circuit 104 for receiving the signal OUTP_BUFF from the source follower circuit 104. The source follower circuit 106 applies OUTM_BUFF to compensate the $G_{ds}$ non-linearity of the source follower circuit 106.

Figure 2:
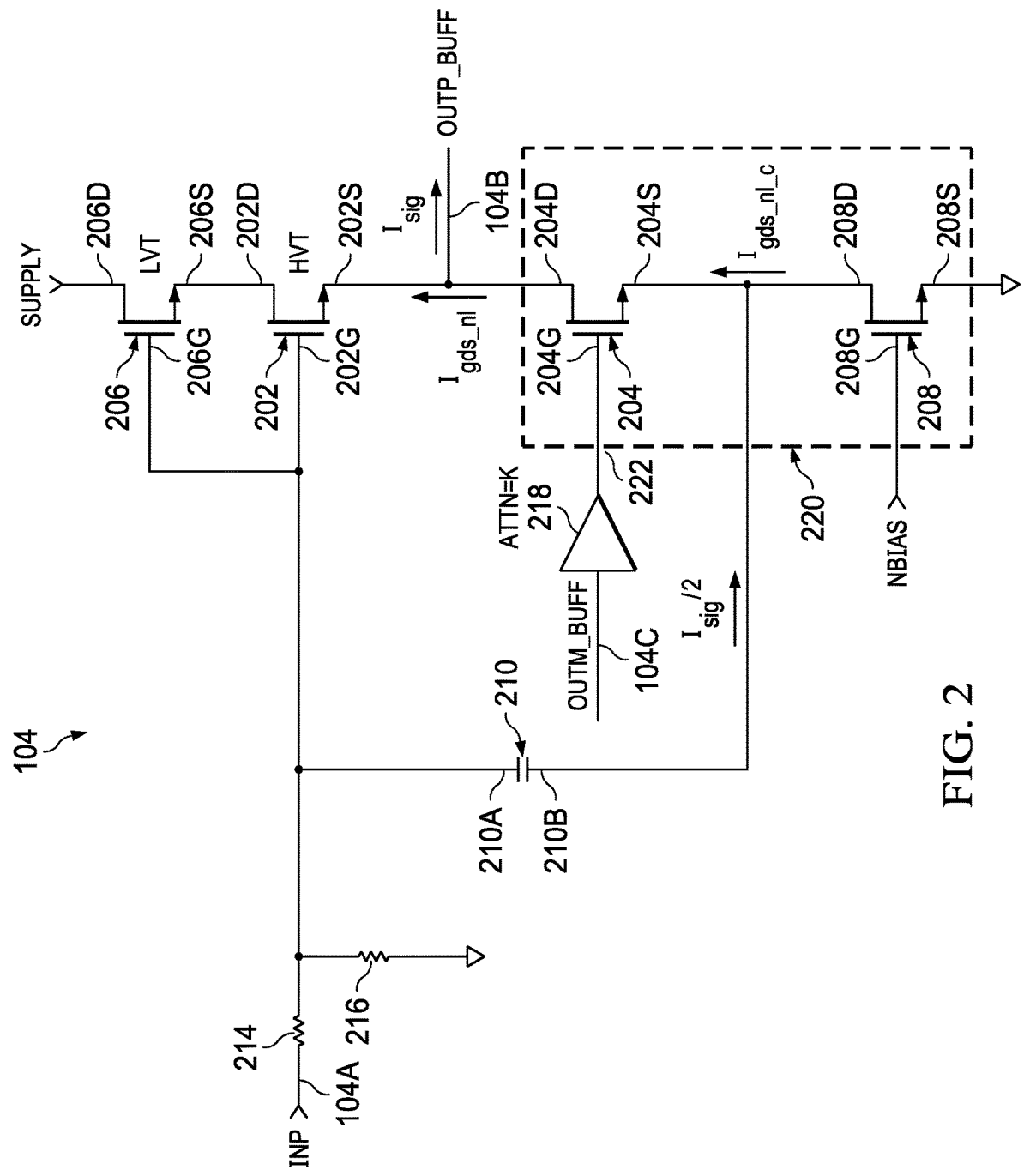
FIG. 2 is a schematic level diagram for an example source follower circuit that includes non-linearity compensation as described herein.

FIG. 2 is a schematic level diagram for an example source follower circuit 104 that includes $G_{ds}$ non-linearity compensation. The source follower circuit 106 may be structurally similar or identical to the source follower circuit 104. The source follower circuit 104 includes an input transistor 202, an input transistor 206, and a current source 220. The current source 220 maintains a constant current from the input transistor 202, and includes a cascode transistor 204, and a load transistor 208. The drain 206D (a drain is a current terminal) of the input transistor 206 is coupled to a power supply (SUPPLY). A source 206S (a source is a current terminal) of the input transistor 206 is coupled to the drain 202D of the input transistor 202. The source 202S of the input transistor 202 is coupled to the output 104B and the drain 204D of the cascode transistor 204. The source 204S of the cascode transistor 204 is coupled to the drain 208D of the load transistor 208. The source 208S of the load transistor 208 is coupled to ground. The gate 206G (a gate is a control terminal) of the input transistor 206 and the gate 202G of the input transistor 202 are coupled to the input 104A.

In FIG. 2, the resistor 214 represents the resistance of a transmission line coupled to the source follower circuit 104. An impedance matching resistor 216 is coupled between the gate 202G of the input transistor 202 and a common potential (e.g. ground).

The input transistor 202 is a high threshold voltage transistor, and the input transistor 206 is a low threshold voltage transistor. For example, the input transistors 202 and 206 may have threshold voltages of about 600 millivolts (my) and about 450 my respectively in some implementations of the source follower circuit 104. The headroom available for the input transistor 202 is the difference of the voltage thresholds of the input transistor 202 and the input transistor 206. For example, the maximum drain-source voltage Vds of the input transistor 202 may be in the range of 140-170 millivolts in some implementations of the 104. The relatively low Vds of the input transistor 202 limits HD3 performance with low power supply voltages (e.g., 1.8V) and higher amplitude input signals (e.g., 2 volts peak-peak).

The feed forward capacitor 210 improves the performance of the source follower circuit with respect to high-frequency conductance non-linearity of the input transistor 202. The feed forward capacitor 210 is coupled between the gate 202G of the input transistor 202 and the source 204S of the cascode transistor 204. The feed forward capacitor 210 sources a portion of the high-frequency load current provided to the output 104B. The capacitance of the capacitor 210 is tuned to the capacitance driven by the output 104B (e.g., the CDAC 108). For example, the capacitance of the feed forward capacitor 210 may be about half the capacitance of the CDAC 108. With the feed forward capacitor 210, the input transistor 202 provides only about half of the high-frequency current at the output 104B (the feed forward capacitor 210 provides about half the high-frequency current), the voltage swing across the input transistor 202 is reduced, and transconductance (Gm) non-linearity of the input transistor 202 is significantly improved.

The feed forward capacitor 210 addresses only high-frequency Gm non-linearity. In the source follower circuit 104, non-linearity at the output 104B is caused by current $I_{gds\_nl}$ flowing in the input transistor 202, which in turn is caused by variation of the voltage $V_{ds}$ across the input transistor 202. $V_{ds}$ is out of phase with INP. $I_{gds\_nl}$ may be expressed as:

$$I_{gds\_nl} = \alpha_3 V_{ds\_M1}^3 \qquad (1)$$

where:

$\alpha_3$ is the HD3 coefficient of the input transistor 202; and $V_{ds\_M1}$ is the drain-source voltage of the input transistor 202.

Equation (1) can also be written as:

$$I_{gds\_nl} = -p\alpha_3 V_{inp}^3 \qquad (2)$$

where:

p is a constant that represents gain from input to output of the source follower circuit 104; and $V_{inp}$ is the voltage of the input signal INP.

To compensate for DC non-linearity arising from swing in Vds of the input transistor 202 and associated $G_{ds}$ modulation, the source follower circuit 104 controls the cascode transistor 204 based on OUTM_BUFF. The gate 204G of the cascode transistor 204 is coupled to an attenuation circuit 218. The attenuation circuit 218 is coupled to the input 104C for receipt of OUTM_BUFF. The attenuation circuit 218 attenuates OUTM_BUFF, and provides attenuated OUTM_BUFF 222 to the gate 204G of the cascode transistor 204. Modulating the cascode transistor 204 based on OUTM_BUFF generates voltage $V_{ds\_MT}$ across the load transistor 208 (e.g. the drain-to-source voltage of transistor 208) which is in phase with the Vds of the input transistor 202. $V_{ds\_MT}$ may be expressed as:

$$V_{ds\_MT} = K * V_{OUTM\_BUFF} \quad (3)$$

where:

$V_{OUTM\_BUFF}$ is the voltage of the signal OUTM_BUFF; and

K is the attenuation applied to the signal OUTM_BUFF by the attenuation circuit 218.

The $V_{ds}$ across load transistor 208 produces a compensation current $I_{gds\_nl\_c}$ flowing through the cascode transistor 204 to the output 104B. $I_{gds\_nl\_c}$ may be expressed as:

$$I_{gds\_nl\_c} = k_3 V_{ds\_MT}^3 \quad (4)$$

where $k_3$ is the HD3 coefficient of the load transistor 208. Equation (4) can be rewritten as:

$$I_{gds\_nl\_c} = K^3 k_3 V_{inm}^3 \quad (5)$$

or $$I_{gds\_nl\_c} = -K^3 k_3 V_{inp}^3 \quad (6)$$

The attenuation factor K, applied to OUTM_BUFF by the attenuation circuit 218, is selected such that HD3 of $G_{ds}$ non-linearity current $I_{gds\_nl\_c}$ is similar to the $G_{ds}$ non-linearity current $I_{gds\_nl}$. Hence, the net current flow ($i_{gds\_nl\_c} \sim I_{gds\_nl}$) reduces the overall non-linearity of the current $I_{sig}$ at the output 104B, which is provided to the CDAC 108 for digitization.

Figure 3:
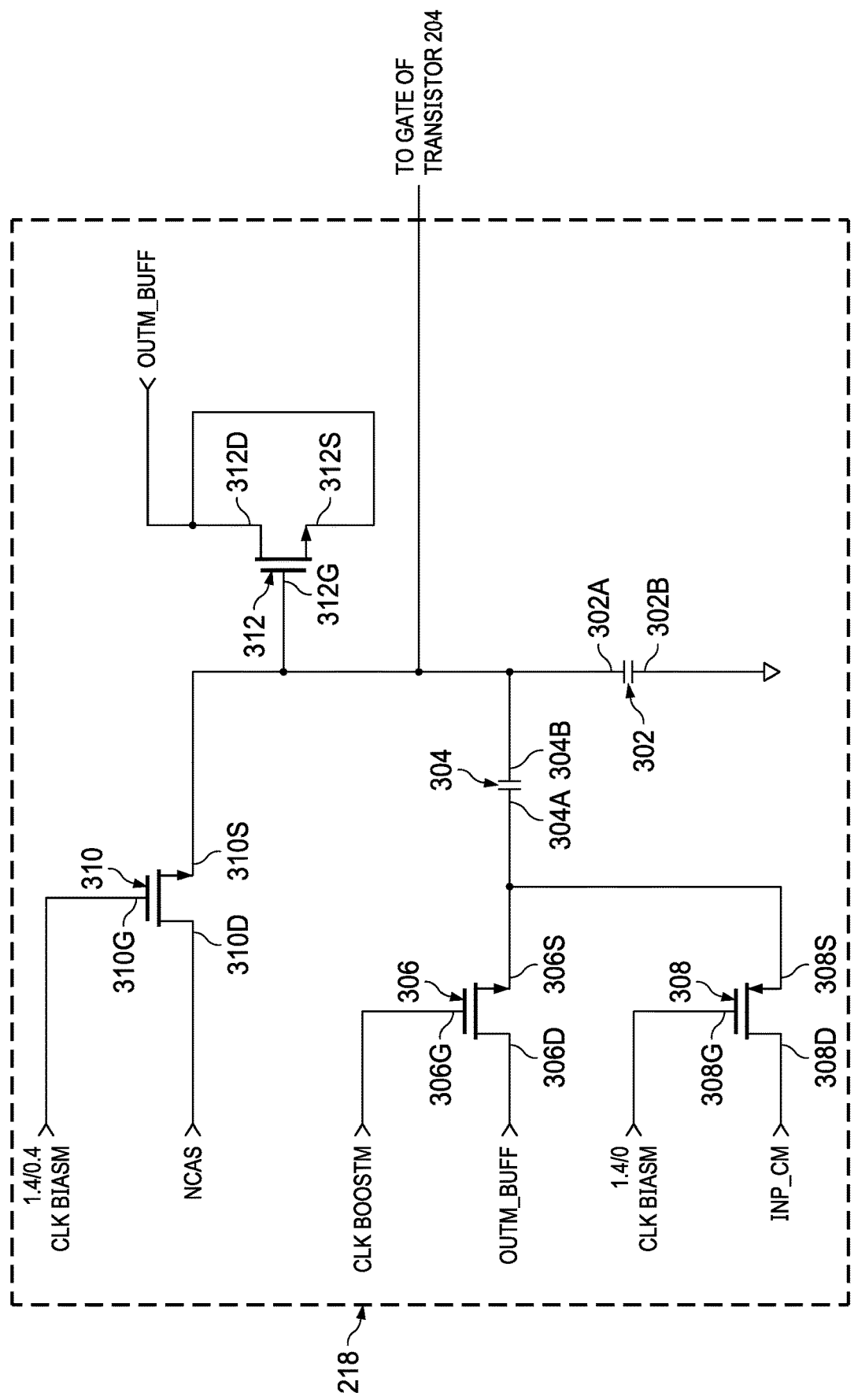
FIG. 3 is a schematic level diagram for an example switched capacitor attenuation circuit suitable for use in the source follower circuit of FIG. 2.

FIG. 3 is a schematic level diagram for an example switched capacitor attenuation circuit 300. The switched capacitor attenuation circuit 300 is an embodiment of the attenuation circuit 218. The switched capacitor attenuation circuit 300 includes capacitor 302, capacitor 304, transistor 306, transistor 308, transistor 310, and transistor 312. The transistors 306, transistor 308, and transistor 310 operate as switches. The transistor 312 is connected as a capacitor to approximate the drain-gate capacitance of the cascode transistor 204. In the switched capacitor attenuation circuit 300, attenuation (K) is obtained as a ratio of capacitance of the capacitor 304 (having a capacitance of $C_x$) to capacitance of the capacitor 302 (having a capacitance of $C_y$).

$$K = \frac{C_x}{C_y} \quad (7)$$

The capacitance of the capacitor 302 may be trimmed (e.g., at manufacture, wafer testing, or in operation by use of a trimming circuit) to set the attenuation factor K. A terminal 302A of the capacitor 302 is coupled to a terminal 304B of the capacitor 304 and the gate 204G of the cascode transistor 204.

The transistor 306 switches OUTM_BUFF to the capacitor 304. The drain 306D of the transistor 306 is coupled to the output 106B of the source follower circuit 106 (FIG. 1). The source 306S of the transistor 306 is coupled to terminal 304A of the capacitor 304. The drain 308D of the transistor 308 is coupled to a reference voltage source, INP_CM. The reference voltage provided by the reference voltage source may be a selected fraction of the INP common mode voltage (e.g., 0.85 volts). The source 308S of the transistor 308 is coupled to the source 306S of the transistor 306. The drain 310D of the transistor 310 is coupled to a bias voltage source, NCAS. The source 310S of the transistor 310 is coupled to the terminal 302A of the capacitor 302. The drain 312D is coupled to the source 312S of the transistor 312 and to the output 106B of the source follower circuit 106 (FIG. 1). The gate 312G of the transistor 312 is coupled to the terminal 302A of the capacitor 302. The transistor 312 compensates for signals passing from the drain 204D to the gate 204G of the cascode transistor 204 via the drain-gate capacitance of the cascode transistor 204 by passing complementary signal from the output 106B to the gate 204G of the cascode transistor 204.

Figure 4:
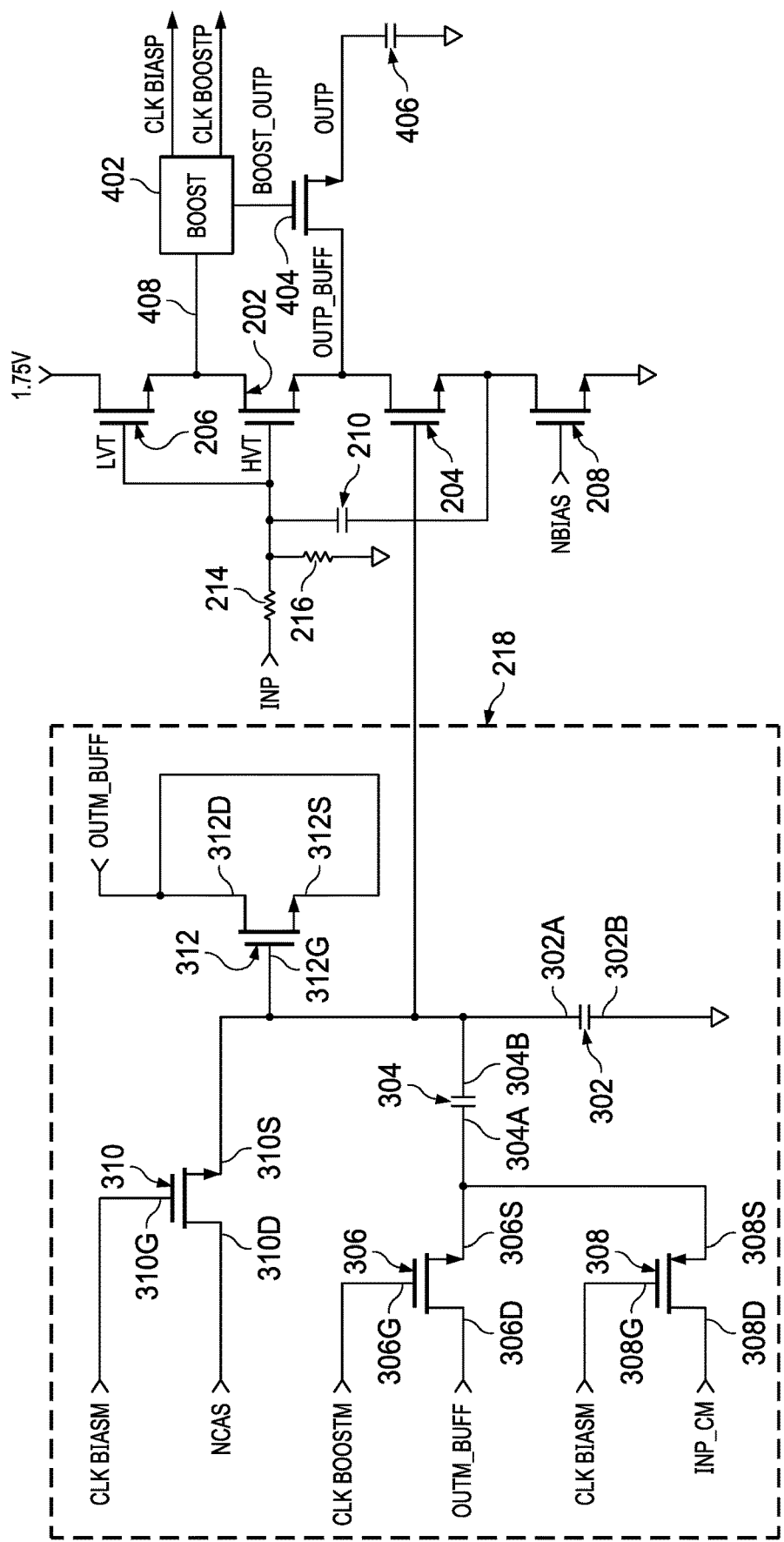
FIG. 4 is a schematic diagram of the switched capacitor attenuation circuit of FIG. 3 applied in the source follower circuit of FIG. 2.

The switching of the transistor 306, the transistor 308, and the transistor 310 is controlled by clock signals CLK_BIASM and CLK_BOOSTM. FIG. 4 shows the switched capacitor attenuation circuit 300 applied in the source follower circuit 104 of FIG. 2. In FIG. 4, the boost circuit 402, the sampling transistor 404, and the sampling capacitor 406 are components of the CDAC 108. The sampling capacitor 406 represents the capacitance of the capacitor ladder of the CDAC 108, and the sampling transistor 404 represents the transistors of the CDAC 108 that switch signal to be digitized onto the capacitor ladder. The boost circuit 402 is coupled to the drain 202D of the input transistor 202 for receipt of the output signal 408. The boost circuit 402 controls the sampling transistor 404 (a sampling switch) that charges the sampling capacitor 406 based on OUTP_BUFF. The boost circuit 402 generates the clock signals CLK_BIASP and CLK_BOOSTP that control the transistors 306, 308, and 310 of the attenuation circuit 218 provided in the source follower circuit 106.

Figure 5:
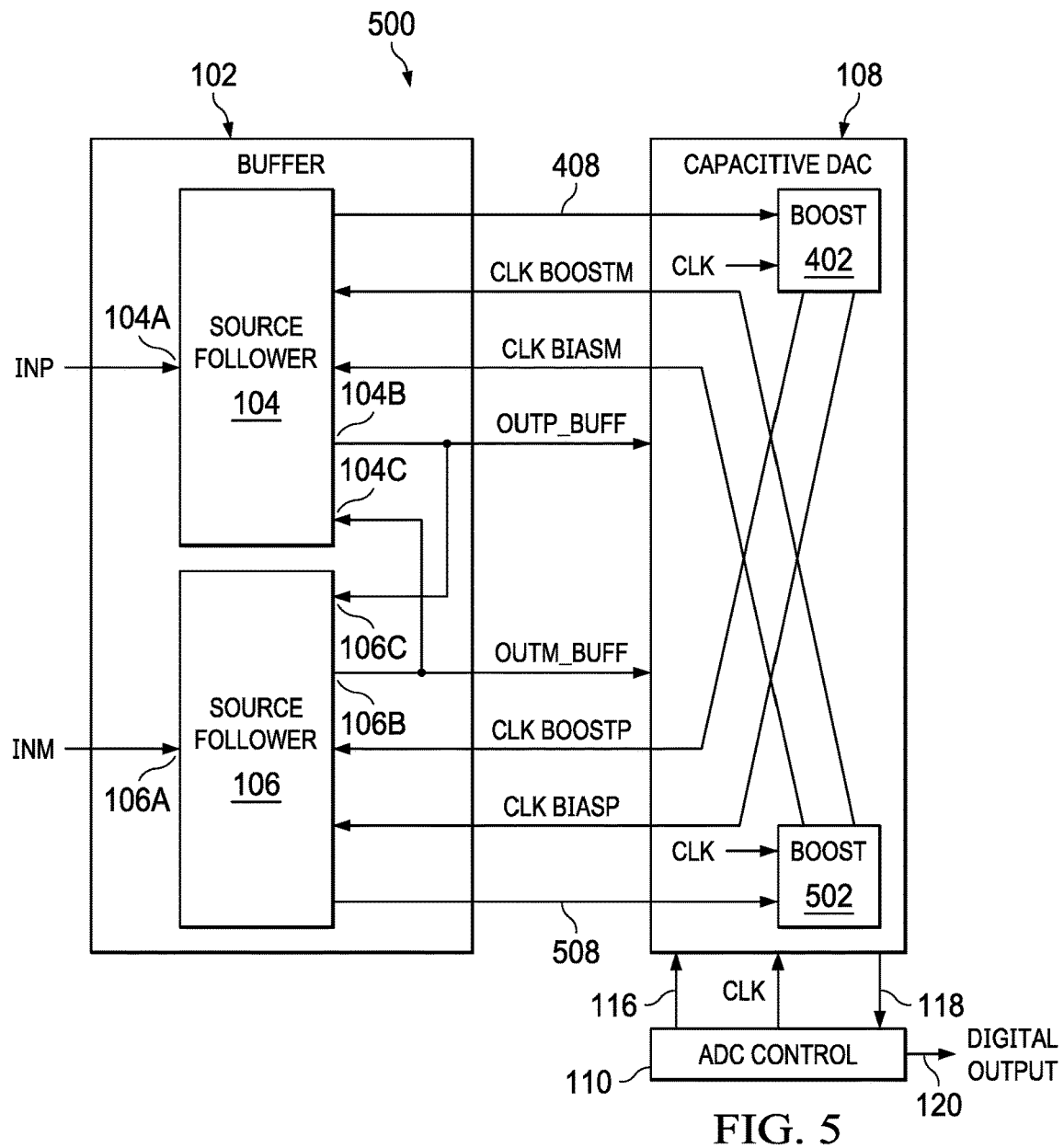
FIG. 5 shows a block diagram for an example ADC that includes source followers with switched capacitor attenuation circuits.

FIG. 5 shows a block diagram for an example ADC 500 that includes source follower circuits 104 and 106 with the attenuation circuit 218. In the ADC 500, the CDAC 108 includes a boost circuit 402 and a boost circuit 502 (which may be similar or the same as boost circuit 402). The boost circuit 402 receives a clock signal, CLK, (provided by ADC control 110 to CDAC 108) and the output signal 408 (signal at the drain 202D of the input transistor 202 in the source follower circuit 104), and generates CLK BOOSTP and CLK BIASP. CLK BOOSTP controls the transistor 306 of the attenuation circuit 218 in the source follower circuit 106. CLK BIASP control the transistors 308 and 310 of the attenuation circuit 218 in the source follower circuit 106. Similarly, the boost circuit 502 receives the clock signal (CLK) and the output signal 508 (signal at the drain 202D of the input transistor 202 in the source follower circuit 106), and generates CLK BOOSTM and CLK BIASM. CLK BOOSTM controls the transistor 306 of the attenuation circuit 218 in the source follower circuit 104. CLK BIASM controls the transistors 308 and 310 of the attenuation circuit 218 in the source follower circuit 104.

Figure 5A:
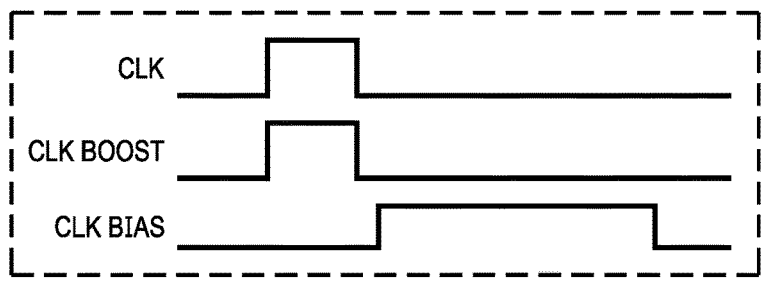
FIG. 5A shows example clock signals suitable for controlling the switched capacitor attenuation circuit of FIG. 3.

FIG. 5A shows examples of the clock signals CLK, CLK_BIAS, and CLK_BOOST. The high portion of the signal CLK may define the acquisition time of the ADC 500. The signal CLK BOOST represents the signal CLK BOOSTP or CLK BOOSTM, and the signal CLK BIAS represents the signal CLK BIASP or CLK BIASM. The timing of the signal CLK BOOST is approximately the same as the timing of the signal CLK. The amplitude of the signal CLK BOOSTP is the same as the amplitude of the output signal 408, and the amplitude of the signal CLK BOOSTM is the same as the amplitude of the output signal 508. The signal CLK BIAS is active (e.g., high) when the signal CLK BOOST is inactive (e.g., low). In some embodiments, the timing of the clock signals provided to the attenuation circuit 218 may differ from the timing shown in FIG. 5A. Returning to FIG. 4, when CLK_BOOSTP is high, OUTP_BUFF is sampled by the sampling transistor 404, and a corresponding signal from the source follower circuit 106 (OUTM_BUFF shown in FIG. 5) is switched to the capacitor 304 by the transistor 306, which is turned on by the signal CLK BOOSTM (CLK BOOSTM the same timing as CLK BOOSTP). When OUTP_BUFF is not being sampled (CLK_ BOOSTP is low), the transistor 310 (under control of CLK BIASM) switches a cascode bias voltage to the capacitor 302, and the transistor 308 (also controlled by CLK BIASM) switches input common mode voltage (e.g., 0.85 volts) to the capacitor 304.

Figure 6:
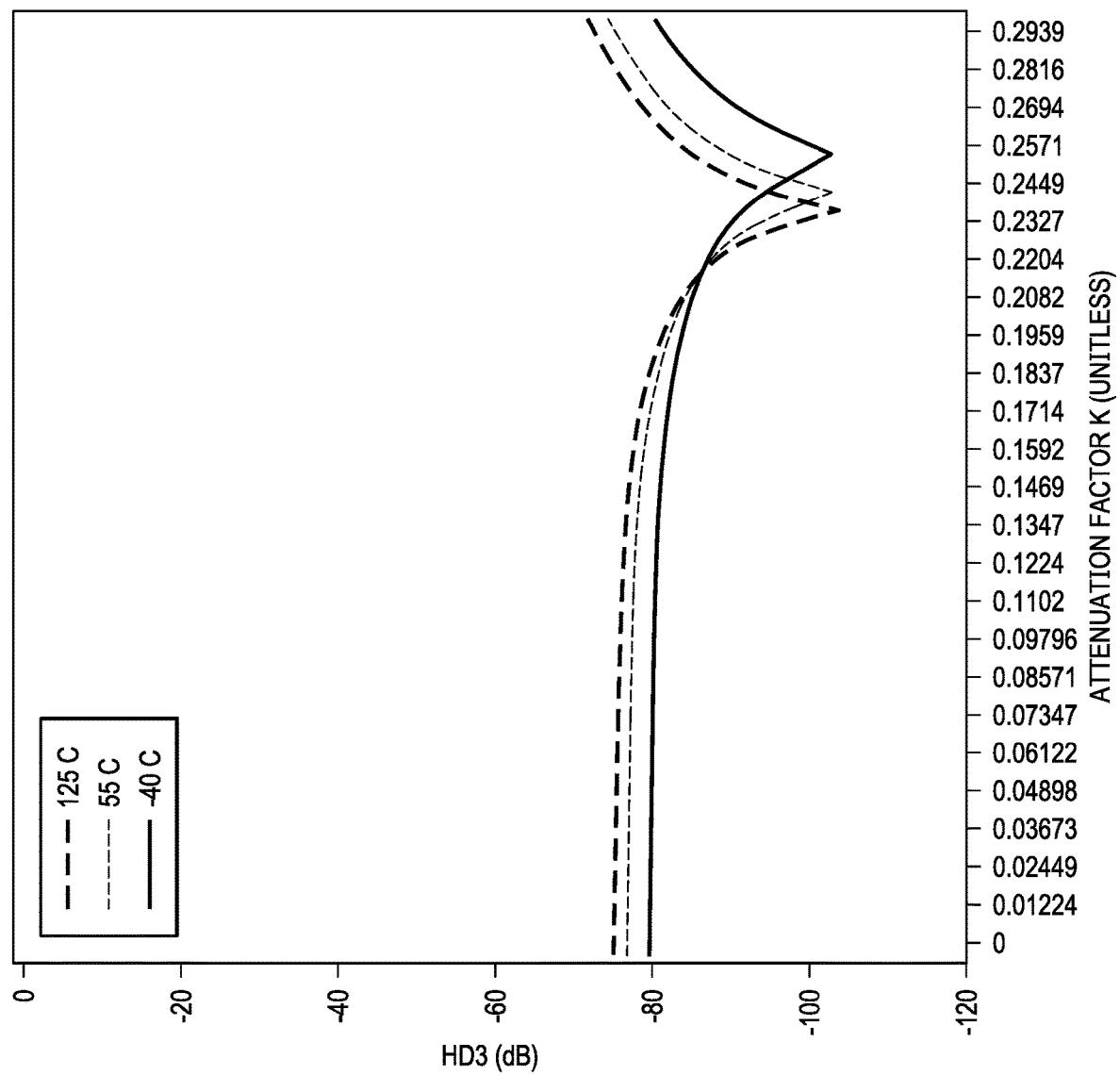
FIG. 6 shows an example graph of third harmonic distortion versus attenuation factor in the source follower circuit described herein.

FIG. 6 shows an example graph of HD3 (y-axis) versus attenuation factor K (x-axis) in an embodiment of the source follower circuit 104. The attenuation factor K is a unitless multiplier. Curves of HD3 versus K are shown for −40 degrees Celsius (° C.), 55° C., and 125° C. The curves show that a value of K can be selected that produces a substantial reduction (e.g., 15 dBC or more) in HD3 over temperature.

Figure 7:
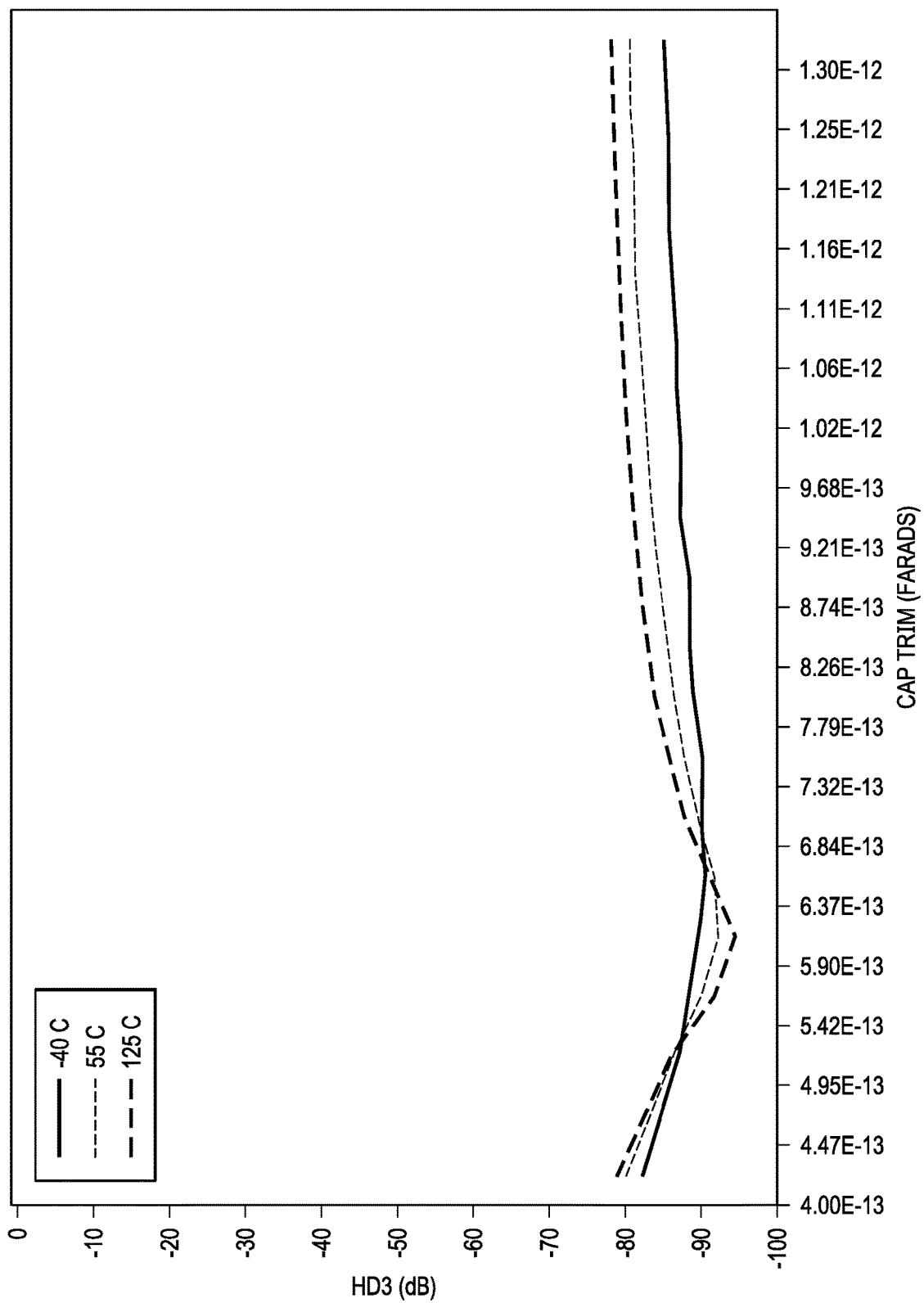
FIG. 7 shows an example graph of third harmonic distortion versus capacitor trim in the switched capacitor attenuation circuit described herein.

FIG. 7 shows an example graph of HD3 versus capacitor trim (value of the capacitor 302 in Farads) in an embodiment of the source follower circuit 104. Curves of HD3 versus capacitor trim are shown for −40 degrees Celsius (° C.), 55° C., and 125° C. The curves show that the capacitor 302 can be trimmed to provide about −90 dB attenuation for HD3, which is a substantial improvement (about 15 dB) over source follower circuits lacking the non-linearity compensation described herein.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While particular transistor structures are referred to above, other transistors or device structures may be used instead. For example, other types of transistors (such as metal-oxide-silicon, MOSFET, or bipolar junction transistors, BJTs) may be utilized. Additionally, the transistors may be implemented as NPN transistors, PNP transistors, pMOSFETs and/or nMOSFETS. The capacitors may be implemented using different device structures (such as metal structures formed over each other to form a parallel plate capacitor) or may be formed on layers (metal or doped semiconductors) closer to or farther from the semiconductor substrate surface.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+1-10 percent of the stated value. Modifications are possible in the described embodiments, and other embodiments are possible, within the scope of the claims.

What is claimed is:

1. A buffer circuit, comprising:
    differential signal inputs;
    a first source follower circuit including:
        a first signal output;
        a first transistor including:
            a control terminal coupled to one of the differential signal inputs; and
            a current terminal coupled to the first signal output;
        a second transistor including:
            a current terminal coupled to the current terminal of the first transistor; and
            a control terminal; and
    a second source follower circuit including:
        a second signal output coupled to the control terminal of the second transistor; and
        a third transistor including:
            a control terminal coupled to one of the differential signal inputs; and
            a current terminal coupled to the second signal output.

2. The buffer circuit of claim 1, wherein the second source follower circuit includes:
    a fourth transistor including:
        a control terminal coupled to the first signal output; and
        a current terminal coupled to current terminal of the third transistor.

3. The buffer circuit of claim 1, wherein:
    the current terminal of the first transistor is a first current terminal;
    the first transistor includes a second current terminal; and
    the first source follower circuit includes:
        a fourth transistor having:
            a control terminal coupled to the control terminal of the first transistor; and a current terminal coupled to the second current terminal of the first transistor.

4. The buffer circuit of claim 1, wherein:
the current terminal of the second transistor is a first current terminal;
the second transistor includes a second current terminal; and
the first source follower circuit includes:
a fifth transistor having:
a first current terminal coupled to the second current terminal of the second transistor; and
a second current terminal coupled to ground.

5. The buffer circuit of claim 1, wherein:
the current terminal of the second transistor is a first current terminal;
the second transistor includes a second current terminal; and
the first source follower circuit includes a capacitor having:
a first terminal coupled to the control terminal of the first transistor; and
a second terminal coupled to the second current terminal of the second transistor.

6. The buffer circuit of claim 1, wherein the first source follower circuit includes an attenuation circuit having:
an input coupled to the signal output of the second source follower circuit; and
an output coupled to the control terminal of the second transistor.

7. The buffer circuit of claim 6, wherein the attenuation circuit includes:
a first capacitor having:
a first terminal coupled to the control terminal of the second transistor; and
a second terminal coupled to ground;
a second capacitor having:
a first terminal coupled to the first terminal of the first capacitor; and
a second terminal coupled to the second signal output.

8. The buffer circuit of claim 7, wherein the attenuation circuit includes:
a first switch having:
a first terminal coupled to the second signal output; and
a second terminal coupled to the second terminal of the second capacitor;
a second switch having:
a first terminal coupled to a reference voltage source; and
a second terminal coupled to the second terminal of the second capacitor;
a third switch having:
a first terminal coupled to a bias voltage source; and
a second terminal coupled to the first terminal of the second capacitor.

9. A buffer circuit, comprising:
a first differential signal input;
a second differential signal input;
a first source follower circuit including:
a first signal output; and
a first input transistor coupled to the first differential signal input and configured to drive the first signal output; and
a second source follower circuit including:
a second signal output;
a second input transistor coupled to the second differential signal input and configured to drive the second signal output; and
a cascode transistor coupled to the second input transistor and the first signal output and configured to compensate for non-linearity of the second input transistor based on an output signal provided at the first signal output.

10. The buffer circuit of claim 9, wherein:
the cascode transistor is first cascode transistor; and
the first source follower circuit includes a second cascode transistor coupled to the first input transistor and the second signal output, and configured to compensate for non-linearity of the first input transistor based on an output signal provided at the second signal output.

11. The buffer circuit of claim 9, wherein:
the second input transistor has a first threshold voltage; and
the second source follower circuit includes:
a third input transistor coupled to the second differential signal input and the second input transistor; and
the third input transistor has second threshold voltage that is lower than the first threshold voltage.

12. The buffer circuit of claim 9, wherein the second source follower circuit includes a capacitor coupled to the second differential signal input and the cascode transistor, and configured to pass a current from the differential inputs to the second signal output.

13. The buffer circuit of claim 9, wherein the second source follower circuit includes an attenuation circuit coupled to the first signal output and the cascode transistor, and configured to attenuate the output signal provided at the first signal output.

14. The buffer circuit of claim 13, wherein the attenuation circuit is switched capacitor attenuation circuit including:
a first capacitor coupled to the cascode transistor;
a first switch configured to switch the output signal to the first capacitor; and
a second switch configured to switch a reference voltage to the first capacitor.

15. The buffer circuit of claim 14, wherein the attenuation circuit includes:
a second capacitor configured to couple the first switch and the second switch to the first capacitor; and
a third switch configured to switch a cascode bias voltage to the first capacitor.

16. An analog-to-digital converter (ADC), comprising:
a capacitive digital-to-analog converter (DAC);
a buffer circuit coupled to, and configured to drive, the capacitive DAC, and including:
differential signal inputs;
a first source follower circuit coupled to the differential signal inputs and having a first signal output coupled to the capacitive DAC; and
a second source follower circuit having:
a second signal output coupled to the capacitive DAC;
an input transistor coupled to the differential signal inputs and configured to drive the second signal output; and
a cascode transistor coupled to the input transistor and the first signal output and configured to compensate for non-linearity of the input transistor based on an output signal of the first source follower circuit.

17. The ADC of claim 16, wherein the second source follower circuit includes an attenuation circuit coupled to the first signal output and the cascode transistor, and configured to attenuate the output signal provided at the first signal output.

18. The ADC of claim 17, wherein the attenuation circuit is switched capacitor attenuation circuit including:
- a first capacitor coupled to the cascode transistor;
- a first switch configured to switch the output signal to the first capacitor; and
- a second switch configured to switch a reference voltage to the first capacitor.

19. The ADC of claim 18, wherein the attenuation circuit includes:
- a second capacitor configured to couple the first switch and the second switch to the first capacitor; and
- a third switch configured to switch a cascode bias voltage to the first capacitor.

20. The ADC of claim 16, wherein:
the input transistor is a first input transistor;
the cascode transistor is a first cascode transistor; and
the first source follower circuit includes:
- a second input transistor coupled to the differential signal inputs and configured to drive the first signal output; and
- a second cascode transistor coupled to the second input transistor and the first signal output and configured to compensate for non-linearity of the second input transistor based on an output signal provided at the second signal output.

* * * * *